(12) United States Patent
Pierce et al.

(10) Patent No.: US 6,256,770 B1
(45) Date of Patent: *Jul. 3, 2001

(54) REGISTER TRANSFER LEVEL (RTL) BASED SCAN INSERTION FOR INTEGRATED CIRCUIT DESIGN PROCESSES

(75) Inventors: David Anthony Pierce, Wheaton, IL (US); Subrata Roy, East Windsor, NJ (US)

(73) Assignee: Lucent Technologies Inc., Murray Hill, NJ (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/390,983

(22) Filed: Oct. 17, 1997

(51) Int. Cl.[7] .................................................. G06F 17/50
(52) U.S. Cl. .................................................. 716/18; 716/4
(58) Field of Search .................... 395/500.19, 500.06, 395/500.05; 714/726, 727, 729, 733, 734; 716/18, 4, 5

(56) References Cited

U.S. PATENT DOCUMENTS 5,748,497 * 5/1998 Scott et al. .......................... 702/181
5,812,561 * 9/1998 Giles et al. .......................... 714/726
5,949,692 * 9/1999 Beausang et al. ..................... 716/18
5,983,376 * 11/1999 Narayanan et al. .................. 714/726

* cited by examiner

Primary Examiner—Matthew Smith
Assistant Examiner—Vuthe Siek
(74) Attorney, Agent, or Firm—Ryan, Mason & Lewis, LLP

(57) ABSTRACT

A design-level description of a circuit is processed to incorporate testability functions in the form of scan chains. The design-level description may be a Register Transfer Level (RTL) description in accordance with the VHDL standard. The design-level description includes processes describing operations of the circuit. The processes are analyzed to identify data carriers in the design-level description which correspond to flip-flops or other specified elements in the circuit. The specified elements are organized into scan chains, which are then allocated to appropriate modules of the circuit. Scan ordering and scan insertion operations are performed separately on each of the modules. The scan ordering operation is based on functional relationships between the data carriers in the processes associated with the modules. The functional relationships can include both word-level and bit-level dependencies. The scan insertion operation involves inserting scan assignment statements into the processes. The modified design-level descriptions of the modules are separately synthesized to generate gate-level descriptions of the circuit modules, such that the overall circuit includes the appropriate scan chains.

27 Claims, 4 Drawing Sheets

```
P1: process (clk)
    variable v1, tmp_v1 : std_logic;
begin
    tmp_v1 := v1;           ← previous value of v1
    if (clk = '1' and clk'event)
    then
        s1 <= v1;        ⎤
        s2 <= x + y;     ⎬ ← functional statements
        v1 := s2 - 1;    ⎦
    .....
        if (scan_mode = '1')
        then
            v1 := s1;        ⎤
            s2 <= tmp_v1;    ⎬ ← scan assignments (s1, v1, s2, s3)
            s3 <= s2;        ⎦
        ...
        end if;
    end if;
end process;
```

REGISTER TRANSFER LEVEL (RTL) BASED SCAN INSERTION FOR INTEGRATED CIRCUIT DESIGN PROCESSES

FIELD OF THE INVENTION

The present invention relates generally to the design of integrated circuits and other complex electonic circuits, and more particularly to circuit design processes which make use of automated computer-implemented design techniques.

BACKGROUND OF THE INVENTION

Application-specific integrated circuits (ASICs) and other types of complex electronic circuits are often designed using Register Transfer Level (RTL) techniques. In an RTL-based design process, the design is initially expressed in a high level computer language such as VHSIC (very High Speed Integrated Circuit) Hardware Description language (VHDL), which is a standard of the Institute of Electrical and Electronics Engineers (IEEE). The design as expressed in the high level language is then converted to a gate-level description using a process referred to as synthesis. The synthesis process optimizes the gate-level description within the area and timing constraints of the particular design. The complexity of the synthesis process typically requires that a large ASIC design be partitioned into several modules which are then synthesized separately, often by different designers. Before entering the synthesis process, the modules are simulated in RTL VHDL format using functional vectors to verify the desired functionality of the module. This simulation is also performed on the complete set of RTL VHDL code for the design.

ASICs and other complex circuits may also make use of Design for Test (DFT) techniques which modify the design to ensure that the final gate-level design is testable for internal faults such as "stuck-at-one" or "stuck-at-zero" conditions on signal lines, A gate-level design is generally considered testable if it is possible to obtain a sufficiently high fault coverage by using test vectors generated by an automatic test pattern generator program or by on-chip logic configured to provide a function referred to as Built-In Self Test (BIST). BIST eliminates the need for test generation and allows at-speed testing by embedding test generation and signature computation hardware within the design. For example, a scan-based BIST technique involves connecting a series of flip-flops in the gate-level design into a scan chain. A control signal may then be set to a particular value in order to place the circuit into a scan mode, such that logic values can be shifted from one flip-flop to the next with every clock cycle, his allows testing of combinational logic between the flip-flops which would otherwise be very difficult to observe and control to a specific value during test.

Conventional scan chains for BIST are often constructed by modifying the flip-flops in the gate-level design. A scan chain implemented in this manner generally results in an extra multiplexor delay for signals passing through the corresponding flip-flops, as well as additional loading on the flip-flop outputs. In RTL-based design applications, this implementation of conventional scan chains can lead to new violations of the timing and area constraints, thus requiring that a computationally-intensive and costly re-optimization phase be performed on the entire design at the end of the design process. Implementing scan-based BIST using conventional techniques thus unduly increases the cost and complexity of the overall design process.

A number of approaches have attempted to implement DFT functions at the RTL VHDL level of a design. These approaches are described in, for example, S. Bhattacharya and S. Dey, "H-SCAN: A High Level Alternative to Full-Scan Testing with Reduced Area and Test Application Overheads," 14$^{th}$ VLSI Test Symposium, IEEE, pp. 74–80, 1996; R. S. Norwood and E. J. McCluskey, "Synthesis-for-Scan and Scan Chain Ordering," 14$^{th}$ VLSI Test Symposium, IEEE, pp. 87–92, 1996; K. D. Wagner and S. Dey, "High-Level Synthesis for Testability: A Survey and Perspective," Proceedings of Design Automation Conference, pp. 131–136, 1996; and C. Papachristou and J. Carletta, "Test Synthesis in the Behavioral Domain," Proceedings of the International Test Conference, IEEE, pp. 693–702, 1995, all of which are incorporated by reference herein. However, each of these approaches has one or more significant drawbacks. For example, some of these approaches fail to provide scan chains which can be used for applying diagnostic or supplementary deterministic vectors, while at least one other fails to provide scan-based BIST functions suitable for use in a wide variety of designs.

SUMMARY OF THE INVENTION

The invention provides techniques for modifying Register Transfer Level (RTL) or other design-level circuit descriptions such that after synthesis the resulting gate-level description includes scan chains that can be used for Built-In Self Test (BIST) or other types of scan testing. In an illustrative embodiment, a complete RTL VHDL description of a circuit is modified to incorporate testability functions in the form of scan chains. The RTL VHDL description includes processes describing operations of the circuit. The processes for the complete circuit description are first analyzed to identify data carriers such as signals or variables which correspond to flip-flops or other specified elements in the circuit. This analysis may involve locating certain types of process structures, such as clocking statements, which are generally associated with the specified elements. The specified elements are organized into scan chains, and different portions of the scan chains are allocated to different modules of the circuit by associating each signal or variable with the module that generates it. These chain selection and allocation operations are performed on the complete RTL VHDL description of the circuit.

After the chain selection and allocation, each of the modules in the RTL VHDL description of the circuit is subject to separate scan ordering, scan insertion and synthesis operations. The scan ordering operation for a given module is based on functional relationships, including both word-level and bit-level dependencies, between the signals or variables in the processes associated with the given module. The scan ordering may analyze the functional relationships between data carriers using a signal-variable graph which includes edges of the form (n1, n2) where n1 and n2 are signals or variables in a process. Priorities assigned to edges of the signal-variable graph are used to order scan chains having desired chain lengths. The scan insertion operation for a given module involves inserting scan assignment statements into the processes associated with the given module. The modified RTL VHDL descriptions of the modules are then separately synthesized to generate gate-level descriptions of the modules, such that the resulting gate-level description of the circuit includes the appropriate scan chains.

The invention, by making use of word-level dependencies, bit-level dependencies and other functional relationships identifiable in the RTL source code, is able to order the scan chains in a manner which substantially reduces the area overhead of the synthesized design.

Moreover, inserting scan chains at the RTL source code level in accordance with the invention allows a designer to utilize the full power of a synthesis process to optimize both the test and functional logic circuitry. This is particularly useful in BIST applications, since the test logic usually needs to operate at the same speed as the functional logic. Because the invention allows test logic and functional logic to be optimized together, the final design is better optimized than it would be in a conventional approach using, for example, gate-level scan insertion followed by a re-optimization phase. The invention can be integrated with an iterative synthesis process, using simple and readily identifiable modifications to VIDL source code, and with substantially no loss of fault coverage as evaluated at the gate level relative to conventional gate-level scan insertion.

DETAILED DESCRIPTION OF THE INVENTION

The following description will illustrate the present invention using an exemplary Register Transfer Level (RTL) design process as applied to exemplary integrated circuits. It should be understood, however, that the invention is not limited to use with any particular type of circuit or design process. For example, although particularly well-suited for use in Built-In Self Test (BIST) applications, the techniques may also be applied to the design of circuits which use externally driven scan test techniques. The term "design-level description" as used herein refers to a description of a circuit or other device in a high level design language such as RTL VHDL. This term is intended to include not only RTL VHDL but also other high level design languages suitable for use in complex circuit design applications. The term "scan chain" is intended to include a set of flip-flops or other logic circuit elements configured to permit testing of combinational logic or other circuitry. For example, scan chains may be connected in a manner that allows shifting in of test vectors which can be applied to combinational logic between the scan chains. The term "process" as used herein is intended to include not only VHDL processes but also other types of constructs in other design languages.

The invention provides techniques for modifying RTL VHDL designs or other high level circuit designs such that after a synthesis process the resulting gate-level design contains scan chains that can be used for BIST and other test functions. As will be shown below, the invention makes use of a mixture of word-level and bit-level dependencies to order the scan chains in a manner which substantially reduces the area overhead of the synthesized design. The use of both word-level and bit-level dependencies in accordance with the invention allows the techniques to be applied to general purpose RTL VHDL designs which contain a mixture of bit-level and word-level functions, and also allows partial usage of a given word-level dependency. The invention also provides a number of other advantages over conventional gate-level scan insertion. For example, designers typically use RTL VHDL to describe their designs, and changes made to RTL VHDL to implement scan chains are therefore readily visible and comprehensible to the designers. In addition, the modified RTL VHDL can be processed by any synthesis tool that works on VHDL, which as previously noted is an IEEE standard. As a result, the modified VHDL can be simulated and synthesized using many different commercially-available software tools. Because the invention allows test logic and functional logic to be optimized together, the final design is better optimized than it would be in a conventional approach using, for example, gate-level scan insertion followed by a re-optimization phase.

Figure 1:
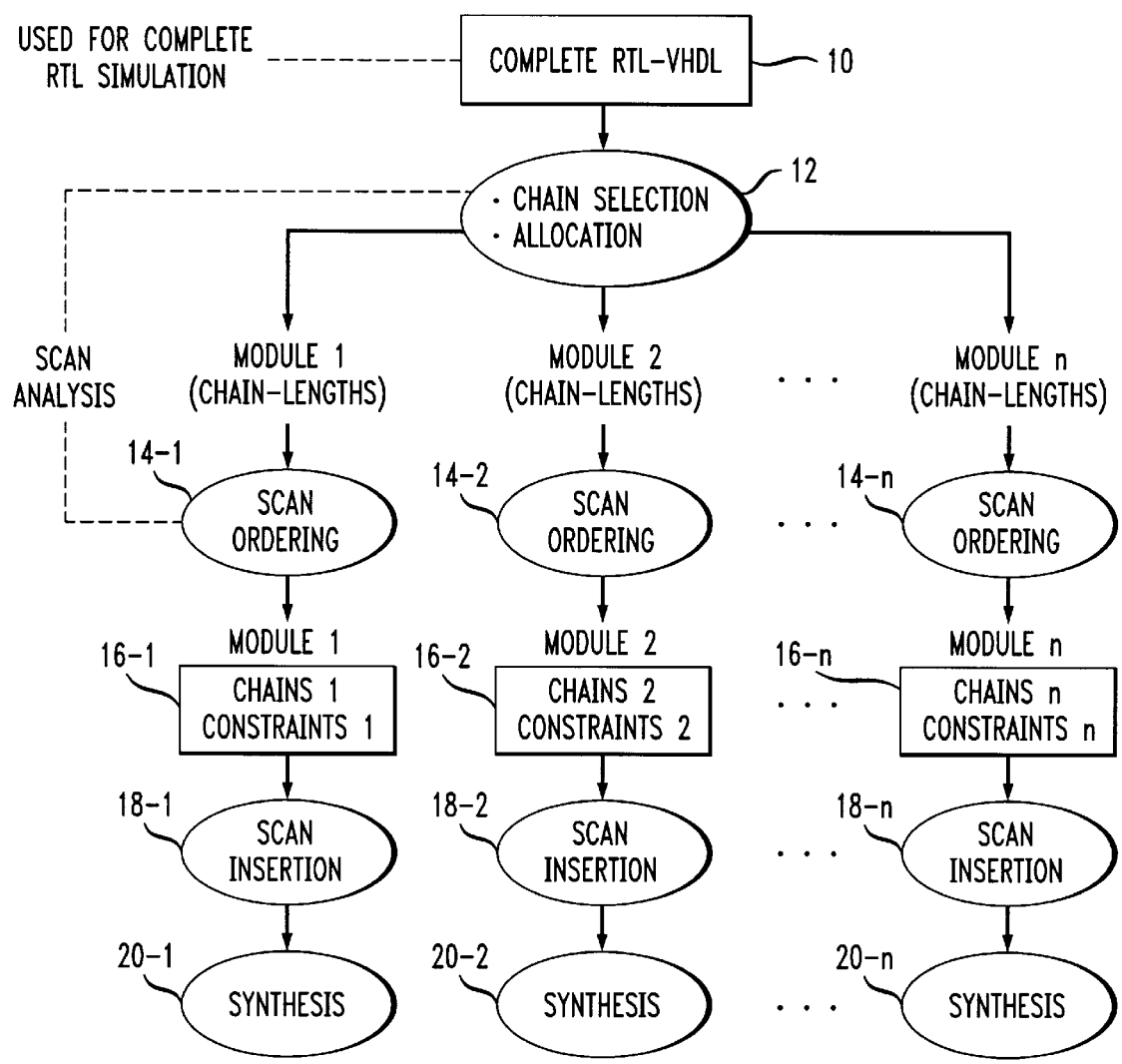
FIG. 1 is a flow diagram illustrating RTL based scan insertion in accordance with an exemplary embodiment of the invention.

FIG. 1 illustrates an exemplary RTL scan insertion process in accordance with the invention. The process includes a scan analysis phase and a scan insertion phase. In the scan analysis phase, VHDL variables and signals to be converted to flip-flops are identified and partitioned into a set of lists representing the scan chains. In the scan insertion phase, the ordered lists are used to insert scan assignments in the appropriate sequential process in the VHDL. These two phases will be described in greater detail below. The process of FIG. 1 begins in step 10 with the complete RTL VHDL for a given circuit design. This RTL VHDL is used for RTL simulation of the entire circuit. Although subsequent synthesis operations are performed separately on each module or sub-circuit of the circuit design, the complete RTL VHDL is available for RTL simulation before any significant synthesis work is done.

A complete RTL VHDL description of a circuit generally includes a hierarchy of VHDL entities. A VHDL architecture, which describes the behavior of an entity, includes a number of concurrent statements. It will be assumed for purposes of illustration that a VHDL architecture includes two kinds of concurrent statements, process statements and component instantiation statements. A process statement is the most general concurrent statement, describing the time behavior of signals through the use of RTL operators and synchronization statements. A component instantiation statement is used to call another VHDL entity. In general, any other concurrent statement can be modeled in terms of a process statement, and the lowest level entities will only contain process statements or equivalents.

Each process statement of the RTL VHDL description is analyzed to identify the flip-flops in the circuit. A process statement generally includes two types of data carriers. Variables and signals. Variables are local to a process and are typically used for intermediate computation. Signals are visible within a VHDL entity and are used for communicating across processes. A set of general rules identifying the data carriers that indicate flip-flops in an RTL VHDL description can be found in R. Airiau, J. M. Berge and V. Olive, "Circuit Synthesis with VHDL," Kluwer Academic Publishers, p. 85, 1994, which is incorporated by reference herein. These general rules can be further simplified depending on the synthesis tool which will be used to synthesize a corresponding gate-level description.

Figure 2:
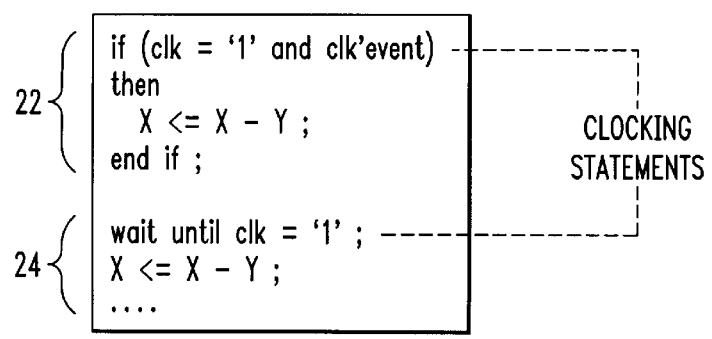
FIG. 2 shows examples of clocking statements which may appear in RTL process code.

A given process statement P1 is analyzed to construct a list ff_list(P1) of data carriers that indicate flip-flops within the process P1. The following operations may be used to construct this list for process P1: (1) locate the clocking statement within the process; (2) for any signal assignment following the clocking statement, add the target signal to the list ff_list(P1); and (3) for any variable assignment following the clocking statement, such that the target variable is read before being the target of an assignment, add the target variable to ff_list(P1). FIG. 2 shows exemplary clocking statements in two different portions 22 and 24 of a process statement. Depending on the synthesis tool used for generating the gate-level description, only a limited number of variants of clocking statements may be permitted. If process P1 is a combinational process, there are no clocking statements and the list ff_list(P1) is empty.

Step 12 of the FIG. 1 process involves chain selection and allocation operations. The chain selection operation of step 12 selects the scan chains for the complete circuit. Selection of scan chains is generally best done on the complete circuit. In a BIST application, as opposed to a scan test application, the number of scan chains is not limited by the number of input and output pins in the circuit. It is therefore generally desirable in BIST applications to have a larger number of scan chains of shorter length. Such scan chains are usually better balanced if scan chain selection is performed on the complete circuit. In the chain selection operation, a signal/variable name svname in the list ff_list(P1) can be uniquely identified relative to the complete circuit by the triplet (<entity-path>, P1, svname), where <entity-path> is the hierarchical path to the instance described by the VHDL entity containing the process P1. By analyzing all of the processes in the VHDL entity hierarchy, it is possible to construct the complete list of potential flip-flops. The resulting complete list is partitioned into several chains of approximately equal size based on user-specified parameters such as maximum chain length and/or number of chains.

The allocation operation of step 12 involves allocating parts of the chains for the complete circuit to one of n corresponding modules that are to be synthesized separately. Since the chains will be subsequently reordered, each module retains a list of chain lengths {l1, l2, . . . ln} for all of the chains, as shown at the output of step 12 in FIG. 1. The scan chains selected by analyzing the complete RTL VHDL description are allocated to each module by associating a given signal or variable with the module which generated it. Once the chain lengths are determined for each of the modules, the remaining scan ordering, scan insertion and synthesis steps can be performed separately for each module.

The next step in the FIG. 1 process includes scan ordering operations 14-1, 14-2, . . . 14-n for each of the n modules. The scan ordering operations construct new chains for the specific modules based on the list of chain lengths {(l1, l2, . . . ln}. The data carriers in a given scan chain are generally ordered based on a functional relationship. This allows the synthesis process to share functional logic with test logic during design optimization. For example, a demonstration of how a word-level functional data transfer of an n-bit value between two n-bit registers can be used in a scan mode by modifying the control logic is described in the above-cited S. Bhattacharya and S. Dey reference, "H-SCAN: A High Level Attentive to Full-Scan Testing with Reduced Area and Test Application Overheads," 14th VLSI Test Symposium, IEEE, pp. 74–80, 1996. A bit-level logical relationship among scan variables which allows implementation of scan with less than multiplexer overhead is described in the above-cited R. S. Norwood and E. J. McCluskey reference, "Synthesis-for-Scan and Scan Chain Ordering," 14th VLSI Test Symposium, IEEE, pp. 87–92, 1996. In practice, RTL designs contain a mixture of word-level and bit-level dependencies or functional relationships, so the reliance on only word-level or only bit-level relationships in the above references fails to provide an optimal ordering of scan chains in the RTL design. As previously noted, the present invention provides improved RTL scan insertion by making use of both word-level and bit-level dependencies.

Figure 3:
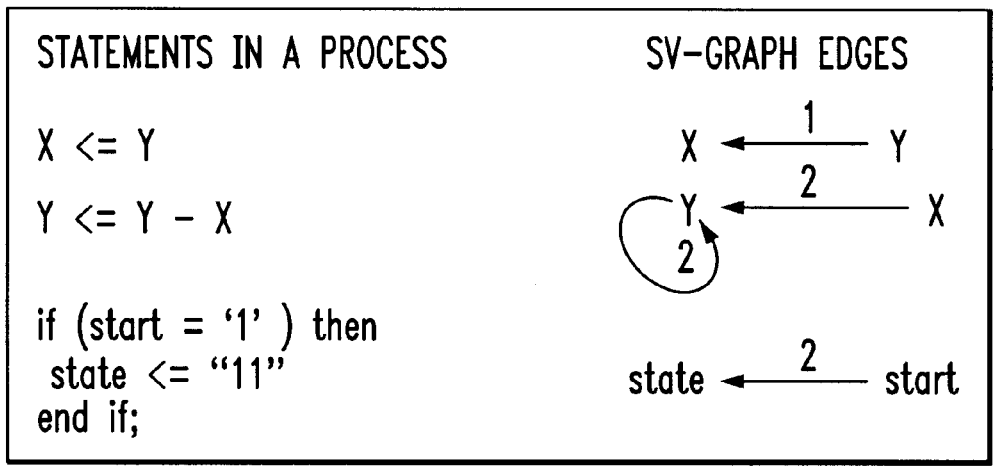
FIG. 3 illustrates the construction of an SV-graph from corresponding statements in an RTL process.

The functional relationship among data carriers is analyzed in operations 14-1, 14-2, . . . 14-n in terms of a signal-variable graph (SV-graph) which includes edges of the form (n1, n2) where n1 and n2 are signals or variables in a process. For each type of statement within a process there is a rule for constructing an edge in the SV-graph. An SV-graph in accordance with the invention may include edges which correspond to word-level dependencies as well as bit-level dependencies. FIG. 3 shows a number of examples of statements in a process and the corresponding rules for constructing edges in an SV-graph for those statements. Edges corresponding to a direct assignment are labeled with a priority of 1, while all other edges are labeled with a priority of 2, as shown in FIG. 3. Word-level dependencies are expressed in statements which operate on specified words or bytes of data, while bit-level dependencies are expressed in statements which operate on specified bits of data. The first two examples in FIG. 3 correspond to word-level dependencies and thus generate word-level edges in the SV-graph. Bit-level dependencies are often expressed in the form of "if" statements. The last example in FIG. 3 corresponds to a bit-level dependency which generates a bit-level edge in the SY-graph. SV-graphs are constructed for each process in each VHDL entity, and the graphs are then merged to form an SV-graph for a hierarchy of entities as shown in FIG. 4.

Figure 4:
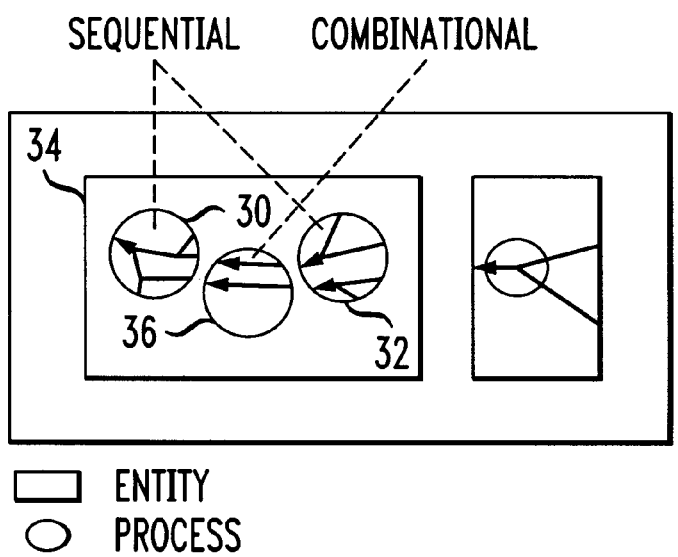
FIG. 4 illustrates merging of SV-graphs in accordance with the invention.

The boxes in FIG. 4 correspond to VHDL entities, while the circles correspond to processes. The processes 30 and 32 in VHDL entity 34 are sequential processes, while the process 36 in entity 34 is a combinational process. In accordance with the merger process, any SV-graph node (IN) that is not a potential flip-flop or an input or output port of the top level entity in the module is removed by replacing edges of the form (x, IN) and (IN, y) with an edge (x, y). The SV-graph for a given entire entity is used to order flip-flops and thereby construct chains to meet the sizes specified for that entity in the list of chain lengths {l1, l2, . . . ln}. The edges on the SV graph are selected in order of their priority and chains are constructed in a step-by-step manner in order to ensure that the resulting chains have the appropriate lengths. The output of the scan ordering operations 14-1, 14-2, . . . 14-n of FIG. 1 are a corresponding set of chains, and synthesis constraints required for subsequent synthesis, for each of the n modules, as shown generally at 16-1, 16-2, . . . 16-n.

The scan insertion operations 18-1, 18-2, . . . 18-n for the n modules are performed by adding VHDL assignment statements within each process. The objective is to perform scan insertion with minimal modifications to the RTL VHDL source code. As an illustration of the scan insertion operation, it will be assumed that d1 and d2 are adjacent data carriers in a given scan chain in which the scan direction is form d1 to d2. The operation will be described first for the case in which d1 is a signal, and then for the case in which d1 is a variable. If d1 is a signal, an assignment of the form "d2<=d1" or "d2 :=d1" is added to the process P1 depending on whether d2 is a signal or a variable. If d2 is a signal, the process P1 is chosen such that d2 belongs to ff_list(P1). This choice of the process P1 ensures that a given signal is not driven by two different processes. If d2 is a variable, P1 generally must be the process in which the variable is defined. These assignments may be made conditional on a scan mode signal and added as a last statement in the process.

Figures 5, 6:
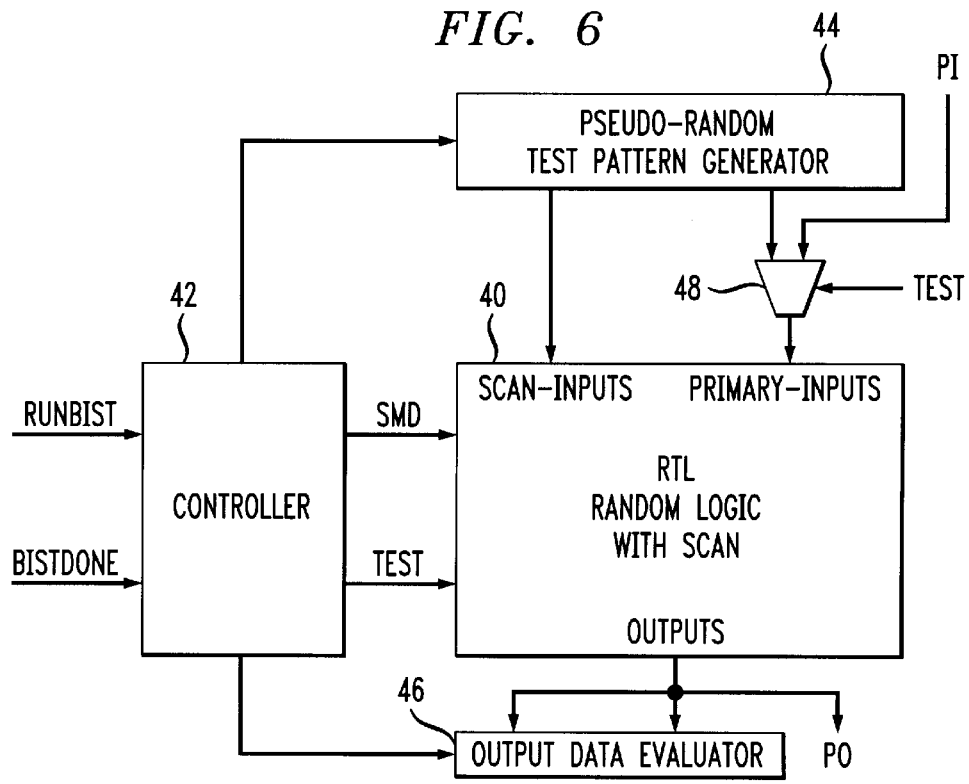
FIG. 5 shows a set of RTL process code with scan insertions in accordance with the invention.
FIGS. 6 and 7 illustrate exemplary Built-In Self Test (BIST) and scan test environments, respectively, for testing scan-inserted RTL designs generated in accordance with the invention.

FIG. 5 shows an exemplary process P1 in which scan assignments have been inserted. The scan assignments "v1:=s1" and s3<=s2" in the process P1 of FIG. 5 illustrate assignments made conditional on a scan mode signal and added as last statements in the process. It should be noted that the functional statements shown in FIG. 5 have not been modified in any way. The semantics of signal/variable assignment ensures that the last assignment is effective. Moreover, the fact that d1 is a signal ensures that the value of d1 used in the scan assignment is the value that existed prior to entering this particular process.

In the case in which d1 is a variable, the techniques described above for the case in which d1 is a signal are generally not appropriate, since intermediate assignments to d1 in the functional or scan statements will affect the value of d1 used in the scan assignment "d1:=d2." In other words, d2 will not take the value of d1 from the previous clock cycle. This situation is remedied by declaring a temporary variable tmp_d1, adding an assignment "tmp_d1 :=d1" at the beginning of the process, and using "d2 :=tmp_d1" or "d2<=tmp_d1" as the scan assignment at the end of the process. The temporary value declaration "tmp_v1 :=v1" and scan assignment "s2 :=tmp_v1" in the FIG. 5 process illustrate this technique.

The scan insertion operations 18-1, 18-2, . . . 18-n further include changing input and output ports of various entities as well as component instantiation in order to connect scan data across the hierarchy of entities. This part of the process should make use of existing entity ports as much as is reasonably possible. After the scan operations 18-1, 18-2, . . . 18-n are completed, the n modules are separately synthesized in corresponding synthesis operations 20-1, 20-2, . . . 20-n. The synthesis operations generate gate-level descriptions for each of the modules. These gate-level descriptions will include scan chains inserted in the manner described above. As previously noted, the insertion of scan chains at the RTL level in accordance with the invention avoids the re-optimization problems associated with conventional gate-level scan insertion.

A scan-inserts RTL design developed using the process of FIG. 1 may be tested in at least two different test environments. FIG. 6 shows a circuit 40 which corresponds to an exemplary set of scan-inserted RTL random logic. The circuit 40 is interconnected with BIST logic for testing in a BIST environment. The BIST logic surrounding the circuit 40 includes a controller 42, a pseudo-random test pattern generator 44, an output data evaluator 46 and a multiplexer 48. The pseudo-random test pattern generator 44 generates random patterns that are supplied to the scan chains and primary inputs of the circuit 40 during a test mode. The multiplexer 48 under control of the select signal TEST applies the output of the test pattern generator 44 to the primary inputs of the circuit 40 in place of the primary input signal PI. The output data evaluator 46 evaluates the scan chain outputs and primary outputs of circuit 40 including output PO at each clock cycle and creates a bit vector in an internal "signature" register at the end of a complete BIST session. The controller 42 starts a BIST session in response to an external signal RUNBIST, and sets the BISTDONE signal at the end of the BIST session. The "signature" value in the register of the output data evaluator 46 at the end of the BIST session can be scanned out and compared against a predetermined acceptable signature to determine if the circuit 40 passed the test.

The BIST logic of FIG. 6 including the controller 42, pattern generator 44, data evaluator 46 and multiplexer 48 may also be designed in an RTL VHDL format and synthesized along with the scan-inserted RTL random logic of circuit 40. It should be noted that care should be exercised in setting up the constraints for the primary inputs of the scan-inserted RTL random logic circuit, since these inputs in the BIST environment will receive random signals through multiplexer 48 in the test mode. Although this may impose tighter timing constraints on the primary input PI, the impact may not be significant if the primary inputs are buffered in registers before any significant combinational processing.

Figure 7:
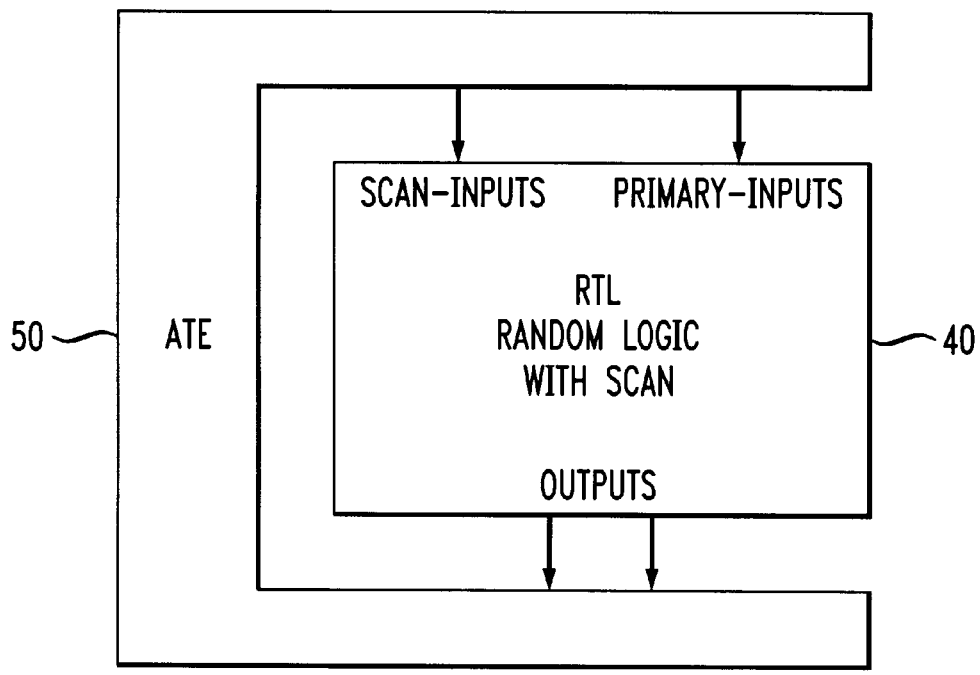

FIG. 7 shows an alternative environment in which a scan-inserted RTL design developed using the process of FIG. 1 may be tested. The environment of FIG. 7 is generally referred to as a scan test environment. The scan-inserted RTL random logic circuit 40 is interconnected with a set of automated test equipment (ATE) 50 as shown. The ATE 50 is capable of applying a pre-specified set of test vectors to the scan inputs and the primary inputs of the circuit 40, and observing the scan outputs and the primary outputs to determine if there is a mismatch between observed and expected results at any clock cycle. The test vectors may be generated using an automatic test pattern generator (ATPG) program which generates appropriate test vectors based on, for example, a gate level netlist and a description of the scan chains.

Figure 8:
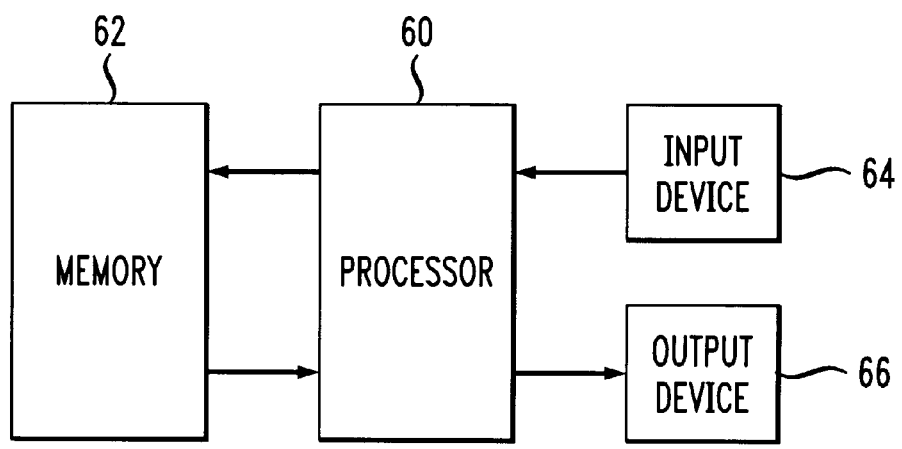
FIG. 8 shows an exemplary system in which the RTL-based scan insertion techniques of the invention may be implemented.

FIG. 8 shows an automated design system in which the RTL-based scan insertion techniques of the invention may be implemented. The system of FIG. 8 includes a processor 60 which operates in conjunction with a memory 62 to run a set of VHDL design software as well as other programs such as a synthesis tool and an ATPG program. The VHDL design software may provide a VHDL parser and a procedural interface to a VHDL syntax tree, as described in, for example, LEDA VHDL System, User's Manual Version 4.0.0, LEDA S. A., Meylan, France, which is incorporated by reference herein. This VHDL software may be used to identify clocks, signals and variables that indicate flip-flops, and to generate an SV-graph for each process. The processor 60 may represent a central processing unit of a personal computer, workstation, mainfrre computer or other suitable digital processing device. The memory 62 may be an electronic memory or a magnetic or optical disk-based memory, or various combinations thereof. A designer interacts with the VHDL design software run by processor 60 to provide appropriate inputs via an input device 64 which may be a keyboard, disk drive or other suitable source of design information. The processor 60 provides outputs to the designer via the output device 66, which may be a display, a printer, a disk drive or various combinations of these and other elements.

The above-described embodiments of the invention are intended to be illustrative only. Numerous other alternative embodiments may be devised by those skilled in the art without departing from the scope of the following claims.

What is claimed is:

1. A method of implementing test capabilities in a circuit expressed in a design-level description using hardware description language code, the design-level description including a plurality of hardware description language processes describing operations of the circuit, the method comprising the steps of:

allocating portions of specified scan chains to different modules of the circuit based on an analysis of the design-level description and without specifying scan ordering for particular ones of the modules;

ordering scan chain representations for at least a given one of the modules of the circuit based on a functional relationship between data carriers in one or more of the hardware description language processes, wherein the data carriers correspond to specific types of elements in the circuit, such that the scan chain representations for at least the given module of the circuit are ordered using information visible in the hardware description language code of the design-level description; and inserting scan assignment statements in the hardware description language code of the design-level description associated with one or more of the hardware description language processes, prior to applying a synthesis process to the design-level description of at least the given module of the circuit, such that a gate-level description of at least the given module of the circuit generated by the synthesis process applied to the design-level description includes the allocated portions of the scan chains for use in testing the circuit.

2. The method of claim 1 further including the steps of:

analyzing the processes to identify the data carriers in the design-level description which correspond to specific types of elements in the circuit; and generating the scan chain representations using the identified data carriers.

3. The method of claim 1 wherein the design-level description is an RTL VHDL description.

4. The method of claim 2 wherein the step of analyzing the processes to identify data carriers further includes analyzing the processes to identify data carriers that correspond to flip-flops in the circuit.

5. The method of claim 2 wherein the step of analyzing the processes further includes locating clocking statements within the processes.

6. The method of claim 2 wherein the generating step further includes the step of allocating different portions of the scan chain representations to different modules of the circuit.

7. The method of claim 6 wherein the ordering and inserting steps are performed separately on each of the modules of the circuit.

8. The method of claim 1 wherein the functional relationships between data carriers in a given process are analyzed in the form of a signal-variable graph which includes edges of the form (n1, n2) where n1 and n2 are signals or variables in the given process.

9. The method of claim 8 wherein edges of the signal-variable graph corresponding to a direct assignment are assigned a first priority, and all other edges are assigned priorities lower than the first priority.

10. The method of claim 8 wherein the signal-variable graph for the processes associated with an entity of the high-level description is used in the ordering step to order scan chains having desired chain lengths.

11. The method of claim 1 wherein the data carriers include variables and signals, such that variables are local to a given process and signals are used for communication between two or more processes.

12. The method of claim 1 wherein the ordering step includes ordering the scan chains based on both word-level and bit-level dependencies in the processes.

13. The method of claim 1 further including the step of utilizing built-in self test circuitry within the circuit to process test signals applied to and output from the scan chains.

14. The method of claim 1 further including the step of utilizing automated test equipment external to the circuit to process test signals applied to and output from the scan chains.

15. An apparatus for implementing test capabilities in a circuit expressed in a design-level description using hardware description language code, the design-level description including a plurality of hardware description language processes describing operations of the circuit, the apparatus comprising:

a memory for storing at least a portion of the design-level description; and at least one processor coupled to the memory, wherein the at least one processor is operative: (1) to allocate portions of specified scan chains to different modules of the circuit based on an analysis of the design-level description and without specifying scan ordering for particular ones of the modules; (2) to order scan chain representations for at least a given one of the modules of the circuit based on a functional relationship between data carriers in one or more of the hardware description language processes, wherein the data carriers correspond to specific types of elements in the circuit, such that the scan chain representations for at least the given module of the circuit are ordered using information visible in the hardware description language code of the design-level description; and (3) to insert scan assignment statements in the hardware description language code of the design-level description associated with one or more of the hardware description language processes, prior to applying a synthesis process to the design-level description of at least the given module of the circuit, such that a gate-level description of at least the given module of the circuit generated by the synthesis process applied to the design-level description includes the allocated portions of the scan chains for use in testing the circuit.

16. The apparatus of claim 15 wherein the processor is further operative to analyze the processes to identify data carriers in the design-level description which correspond to specific types of elements in the circuit, and to generate the scan chain representations based on the identified data carriers.

17. The apparatus of claim 15 wherein the design-level description is an RTL VRDL description.

18. The apparatus of claim 16 wherein the processor is operative to analyze the processes to identify data carriers that correspond to flip-flops in the circuit.

19. The apparatus of claim 16 wherein the processor is operative to analyze the processes locating clocking statements within the processes.

20. The apparatus of claim 15 wherein the processor is operative to allocate different portions of the scan chain representations to different modules of the circuit, such that the order and insert operations are applied separately to different modules.

21. The apparatus of claim 15 wherein the processor is operative to analyze functional relationships between data carriers in a given process using a signal-variable graph which includes edges of the form (n1, n2) where n1 and n2 are signals or variables in the given process.

22. The apparatus of claim 21 wherein edges of the signal-variable graph corresponding to a direct assignment are assigned a first priority, and all other edges are assigned priorities lower than the first priority.

23. The apparatus of claim 21 wherein the signal-variable graph for the processes associated with an entity of the high-level description is used by the processor to order scan chains having desired chain lengths.

24. The apparatus of claim 15 wherein the data carriers include variables and signals, such that variables are local to a given process and signals are used for communication between two or more processes.

25. The apparatus of claim 15 wherein the processor is operative to order the scan chains based on both word-level and bit-level dependencies in the processes.

26. A method of implementing test capabilities in a circuit expressed in a design-level description using hardware description language code, the design-level description including a plurality of hardware description language processes describing operations of the circuit, the method comprising the steps of:

allocating portions of specified scan chains to different modules of the circuit based on an analysis of the design-level description and without specifying scan ordering for particular ones of the modules;

ordering scan chain representations for at least a given one of the modules of the circuit based on functional relationships between data carriers in one or more of the hardware description language processes, the functional relationships including both word-level and bit-level dependencies in the hardware description language processes, such that the scan chain representations for at least the given module of the circuit are ordered using information visible in the hardware description language code of the design-level description; and inserting scan assignment statements in the hardware description language code of the design-level description associated with one or more of the hardware description language processes, prior to applying a synthesis process to the design-level description of at least the given module of the circuit, such that a gate-level description of at least the given module of the circuit generated by the synthesis process applied to the design-level description includes the allocated portions of the scan chains for use in testing the circuit.

27. A method of implementing test capabilities in a circuit expressed in a design-level description using hardware description language code, the design-level description including a plurality of hardware description language processes describing operations of the circuit, the method comprising the steps of:

allocating portions of specified scan chains to different modules of the circuit based on an analysis of the design-level description and without specifying scan ordering for particular ones of the modules;

ordering the scan chain representations for each of the modules of the circuit based on functional relationships between data carriers in one or more of the hardware description language processes; and inserting scan assignment statements in the hardware description language code of the design-level description associated with one or more of the hardware description language processes, prior to applying one or more synthesis processes to the design-level description of the modules of the circuit, such that a gate-level description of the circuit generated by the one or more synthesis processes applied to the design-level description includes the specified scan chains for use in testing the circuit, wherein the ordering and inserting steps are performed separately on each of the modules of the circuit.

\* \* \* \* \*